US005501218A

United States Patent [19]
Usui

[11] Patent Number: 5,501,218
[45] Date of Patent: Mar. 26, 1996

[54] METHOD OF SCANNING IN MRI

[75] Inventor: Yoshiyuki Usui, Kuroiso, Japan

[73] Assignee: Kabushiki Kaisha Toshiba, Kanagawa, Japan

[21] Appl. No.: 384,206

[22] Filed: Feb. 2, 1995

Related U.S. Application Data

[63] Continuation of Ser. No. 968,848, Oct. 30, 1992, abandoned.

[30] Foreign Application Priority Data

Oct. 30, 1991 [JP] Japan ................................. 3-284911
Oct. 27, 1992 [JP] Japan ................................. 4-288953

[51] Int. Cl.$^6$ ................................................. A61B 5/055
[52] U.S. Cl. ........................................ 128/653.2; 324/309
[58] Field of Search ....................... 128/653.2; 324/307, 324/309

[56] References Cited

U.S. PATENT DOCUMENTS 4,715,383 12/1987 Ehman et al. ..................... 128/653.2
5,159,550 10/1992 Sakamoto et al. ............... 128/653.2 X

*Primary Examiner*—Ruth S. Smith
*Attorney, Agent, or Firm*—Ronald L. Yin; Limbach & Limbach

[57] ABSTRACT

A method of scanning in magnetic resonance imaging is disclosed. In the method, a desired diagnostic portion of an object is diagnosed, and then two different slicing planes according to the designated diagnostic portion are selected. Then, magnetic resonance signals from the selected two slicing planes are collected, and scanning ranges in the slicing planes individually decided using the collected magnetic resonance signals. Then the diagnostic portion in accordance with the designated scanning ranges is scanned for diagnosis.

15 Claims, 10 Drawing Sheets

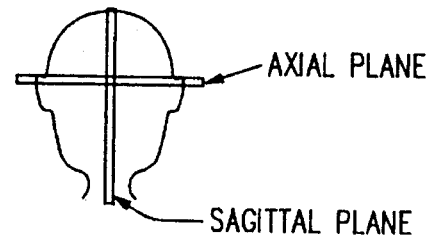
FIG. 4
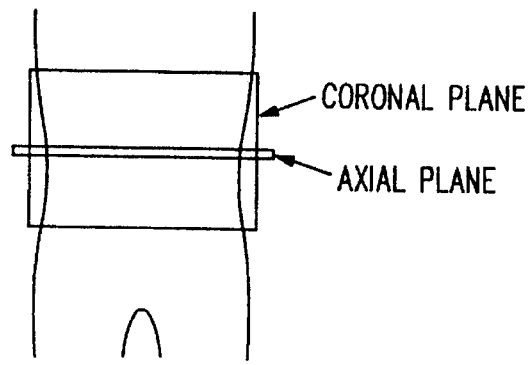
FIG. 5
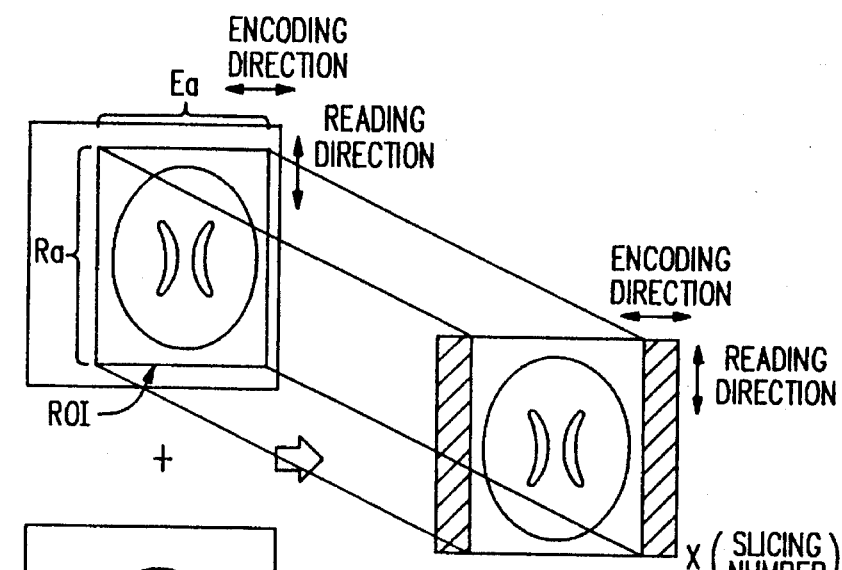
FIG. 6A
FIG. 6C
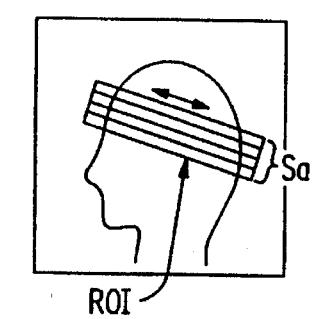
FIG. 6B

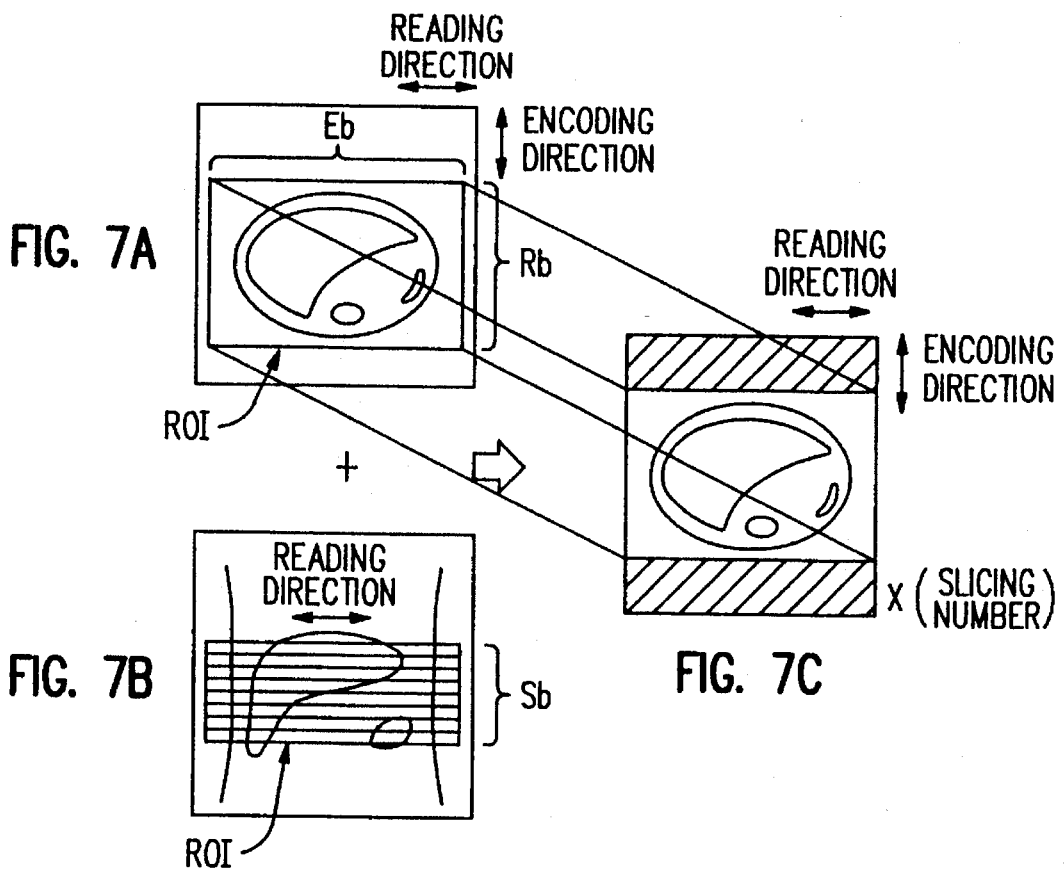
FIG. 7A
FIG. 7B
FIG. 7C
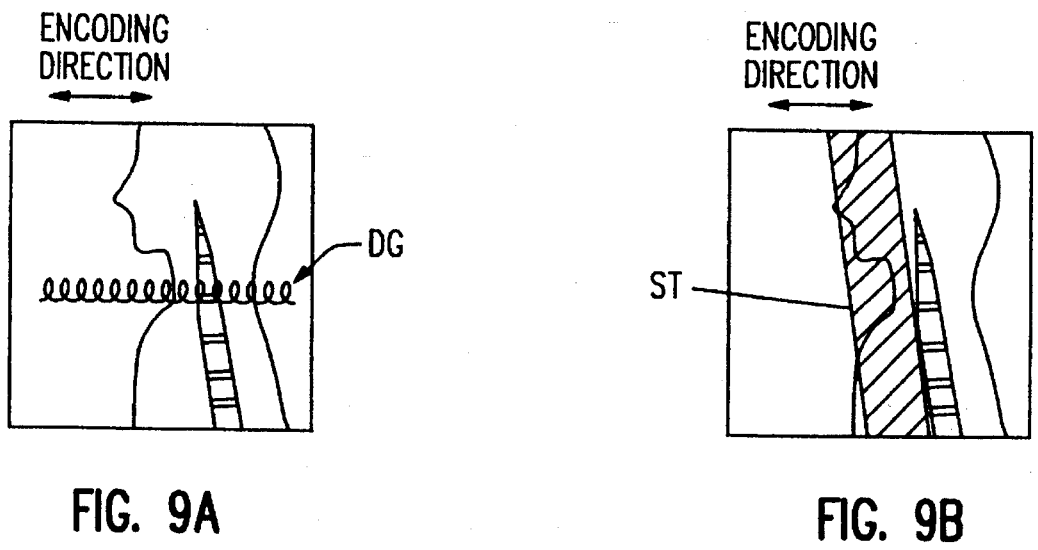
FIG. 9A
FIG. 9B

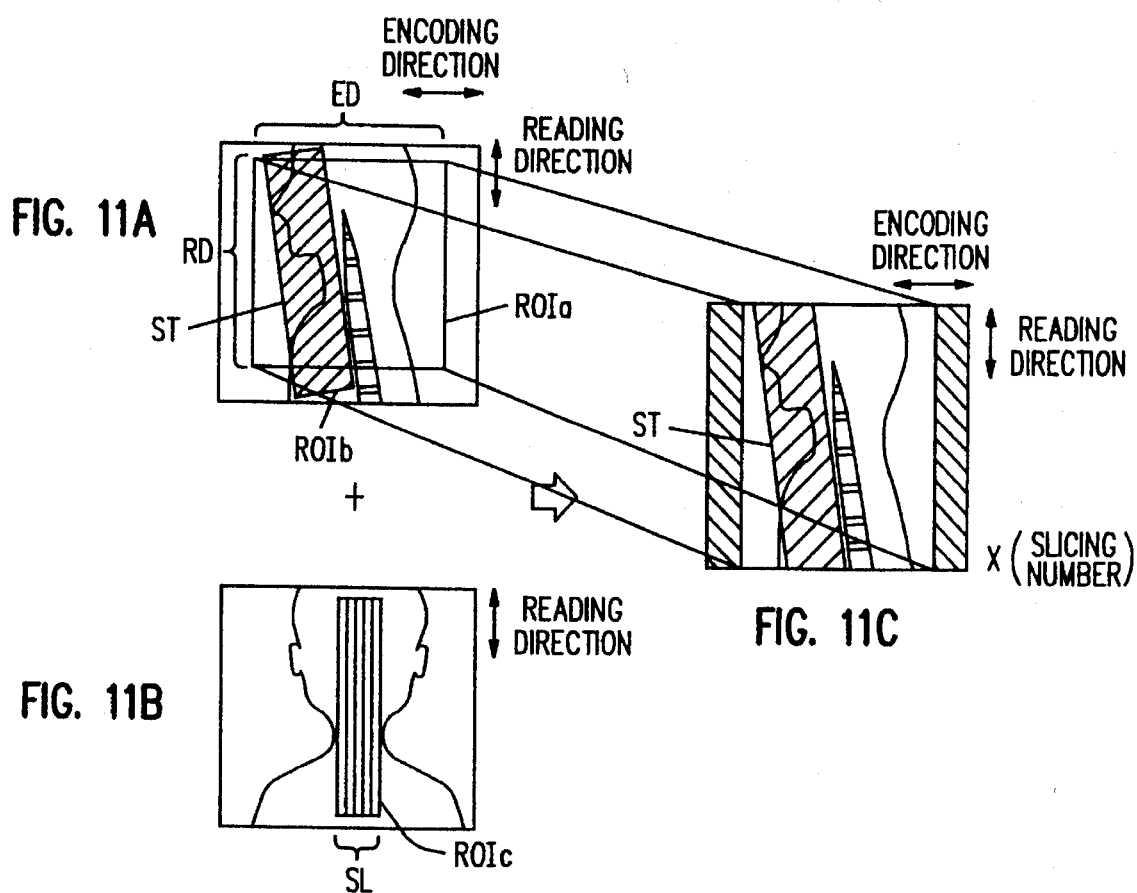
FIG. 11A
FIG. 11B
FIG. 11C
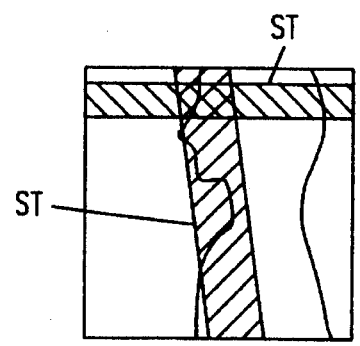
FIG. 12

METHOD OF SCANNING IN MRI

This is a continuation of application Ser. No. 07/968,848 filed on Oct. 30, 1992, now abandoned.

BACKGROUND OF THE INVENTION

The present invention relates to a method of scanning in a magnetic resonance imaging (MRI) method, and more particularly to the method in which slice positions to be scanned in an object being diagnosed are decided before a scanning for diagnosis.

In MRI, an object to be diagnosed is placed in a static magnetic field, whereby atomic nuclei align themselves with the static magnetic field. Then, gradient magnetic fields in three X-, Y- and Z-directions are applied to the object for spatially encoding and a radio frequency (RF) signal is applied to the object for exciting the atomic nuclei in a magnetically sliced plane, which has a certain thickness in a slicing direction, of the object. When the RF signal is removed, magnetic resonance (MR) signals emitted from the sliced plane can be collected. A series of the excitation and MR signal acquisition is performed on a predetermined pulse sequence. The collected MR signals are then processed, for example, by Fourier transformation to form image data of the magnetically sliced plane of the object.

Prior to a scanning for diagnosis in accordance with the above MRI principle, it is usual to perform a preparation step which includes a step of designating a slice position in the scanning for diagnosis. For this step a single sliced image is chosen as a pilot image. The term "pilot image" is here given for this positioning step only.

The positioning using the single pilot image further includes two ways. One is to designate slicing planes crossed perpendicularly to the pilot image displayed on a monitor. This way is called here "cross" plan. The other way involves the designation of slicing planes parallel to the pilot image. This way is called here "same" plan.

Now, the positioning according to the above two ways will be exemplified. By the "cross" plan, for example, a sagittal image of the head of a patient as a pilot image will be first displayed on a monitor. While looking at the sagittal image, an operator designates quantitatively not only a desired scanning range and its center for the object being imaged (i.e., head) in a reading direction (or in an encoding (i.e, phase-encoding) direction), but also a desired slicing range in a slicing direction. At the same time, by using the same sagittal image, the operator is forced to give by his or her approximate estimate (i.e., by intuition) a desired scanning range and its center for the object in the encoding direction (or in the reading direction) whose directional information is not appeared on the monitor screen. According to the designated figures, the scanning will be performed to produce axial images for diagnosis, perpendicular to the sagittal image as the pilot image, of the desired slicing number. The same manner as above can be applied to a patient's abdomen scanning. For instance, the coronal image of the abdomen as a pilot image can be used to produce axial images for diagnosis.

The scanning range and its center thus-designated correspond to a field of view and its center, when diagnostic images are displayed.

However, the "cross plan" has various drawbacks. As said above, it is possible for an operator to quantitatively designate an object center position and a desired scanning range in either of the reading or encoding direction on a pilot image, but it is impossible to designate with confidence those figures in the remaining direction, because information regarding the remaining direction does not appear on the monitor.

Thus, such dependence on an operator's intuition in the designation sometimes causes unfavorable conditions. The object center tends to deviate from the center position of a field of view (FOV) of a monitor screen. This deviation causes a part of the object to go out of the FOV, resulting in the generation of folded artifacts. Hence, it is not easy to utilize a technique being able to changing image ranges, such as a rectangular FOV method and an arbitrary matrix method for reduction in scanning time. There is no guarantee that the operator's intuition with experience is always right. If a FOV designated by the operator's intuition is too small for an object being imaged, folded artifacts will be appeared on axial images obtained in the diagnostic scanning. Contrary, where a rather bigger FOV than an object field range is designated for safety, folded artifacts will be expelled as expected, but longer scanning time is required instead. As a result, it is meaningless to adopt FOV-adjustable techniques.

On the other hand, the above-mentioned "same" plan will be carried out as follows. Suppose that an object being imaged is a patient's head. In this case, for example, an axial image as a single pilot image will be displayed on a monitor. With an operator looking at the monitor screen, he or she is required to quantitatively designate desired scanning ranges and their centers in both the reading and encoding directions. Also required is to give a necessary slicing ranges by his or her intuition with experience. The designation enables the scanning carried out in succession to produce a plurality of parallel axial images for diagnoses.

The "same" plan discussed above has no problems with respect to quantitative designation of the scanning ranges and their centers in both the encoding and reading directions. However, it has no way for confirming a practically-sliced range prior to the scanning. This means that the designation on an operator's intuition sometimes leads to an improper slicing number, a slicing width, and/or slicing gap. This will fail to exactly catch a region being imaged by an entire magnetically-sliced region, thereby requiring to carry out another scanning from the beginning

SUMMARY OF THE INVENTION

Accordingly, it is a primary object of the present invention to provide a method of enabling proper and steady scan planning.

It is another object of the present invention to designate a proper center positions of a object being imaged and desired a FOV in the scan planning, using two pilot images.

It is still another object of the present invention to catch an aimed region without missing.

It is still another object to prevent the designation procedure from being far complicated and keep rather short operation time for scan planning.

It is another primary object of the present invention to be able to favorably adopt FOV-adjustable techniques of altering a view range in the encoding direction.

It is still further object of the present invention to avoid wrap around artifacts in diagnostic images and increased scanning time.

These and other objects can be achieved according to the present invention, in one aspect by providing, a method of scanning in magnetic resonance imaging comprising steps of: designating a desired diagnostic portion of an object being diagnosed, selecting two different slicing planes according to the designated diagnostic portion, the two slicing planes making an angle to each other, collecting magnetic resonance signals from the selected two slicing planes, deciding scanning ranges in said slicing planes individually using the collected magnetic resonance signals, and scanning the diagnostic portion in accordance with the designated scanning ranges.

Preferably, the decision step further comprises, in respect to at least one of the two slicing planes selected in the selection step, steps of: reconstructing an image using the collected magnetic resonance signals, displaying the reconstructed image, and designating at least one of the scanning ranges on the displayed image.

Still preferably, the at least one of the two slicing planes includes an axial plane of the diagnostic portion, the magnetic resonance signal collected from the axial plane is reconstructed into an axial image in the reconstruction step, and the axial image is displayed in the display step.

Still preferably, the at least one of the two slicing planes includes a sagittal plane of the diagnostic portion, the magnetic resonance signal collected from the sagittal plane is reconstructed into a sagittal image in the reconstruction step, and the sagittal image is displayed in said display step.

Still preferably, the at least one of the two slicing planes includes a coronal plane of the diagnostic portion, the magnetic resonance signal collected from the coronal plane is reconstructed into a coronal image in the reconstruction step, and the coronal image is displayed in the display step.

Still preferably, the designation step further includes a step of defining a saturation region on the displayed image.

Still preferably, the decision step further comprises, in respect to one of the two slicing planes selected in the selection step, steps of: first calculating a projected profile size of the diagnostic portion to at least one of predetermined directions in one of the two slicing planes according to the collected magnetic resonance signals, and second calculating the scanning range according to the calculated profile size.

BRIEF DESCRIPTIONS OF THE DRAWINGS

The accompanying drawings which are incorporated in and constitute a part of this specification, illustrate embodiments of the present invention and, together with the description, serve to explain the principles of the present invention. In the drawings:

FIG. 4 illustrates a combination example of pilot images for a patient's head;

FIG. 5 illustrates a combination example of pilot images for a patient's abdomen;

FIG. 6 is an image example illustrating from two pilot images to a diagnostic image for the head imaging;

FIG. 7 is an image example illustrating from two pilot images to a diagnostic image for the abdomen imaging;

FIG. 9A shows an example of an artifact due to deglutition movement;

FIG. 9B shows an example of a saturation region;

FIG. 11 is an image example illustrating from two pilot images to a diagnostic image for a patient's cervical vertebrae;

FIG. 12 is an further example of placing saturation regions;

DESCRIPTION OF THE PREFERRED EMBODIMENTS

Figure 1:
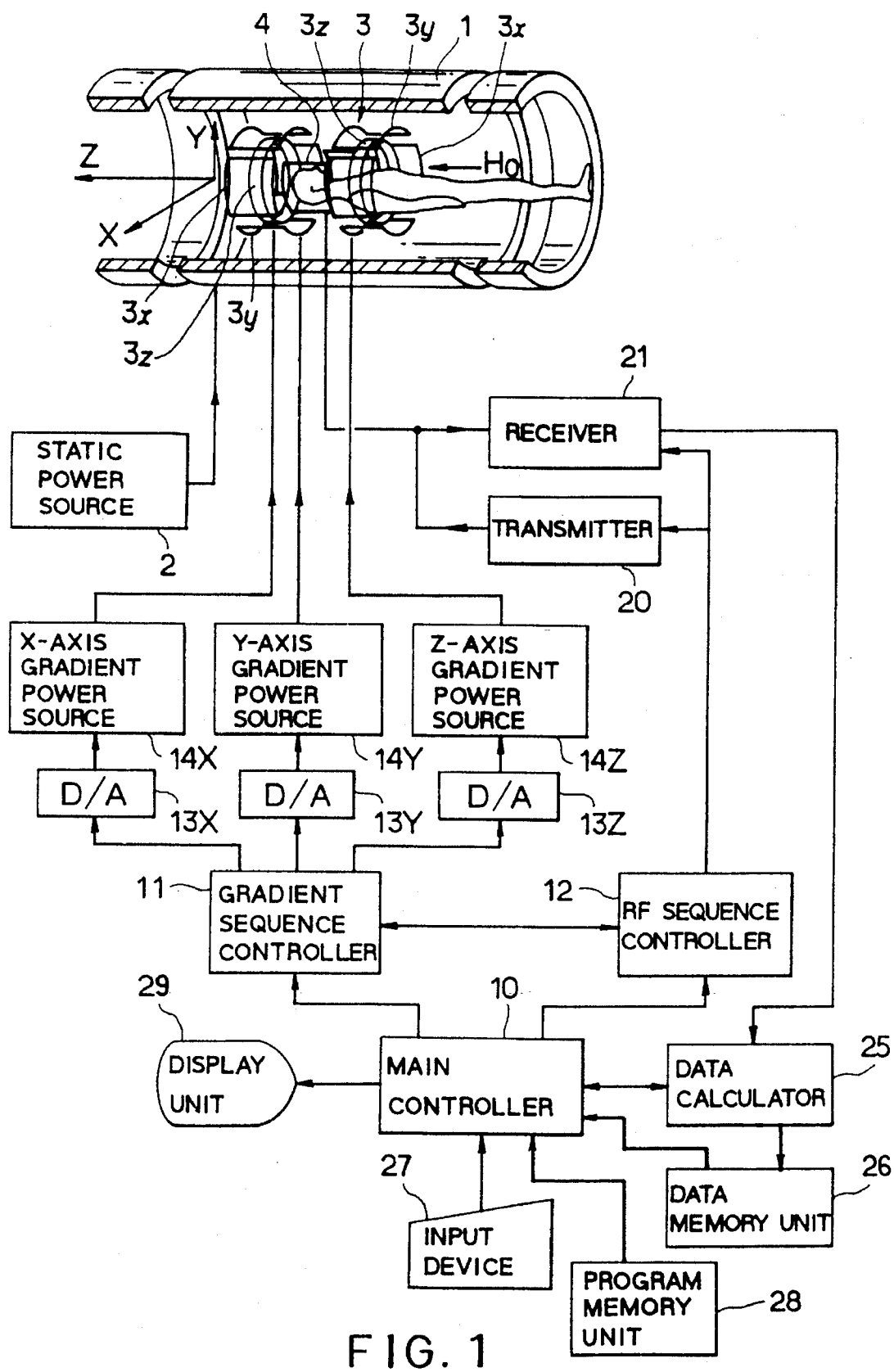
FIG. 1 illustrates in block form an MRI system of a first embodiment according to the present invention.

A first embodiment of the present invention will now be described according to FIGS. 1 to 8. FIG. 1 is a block diagram schematically representing a whole construction of an MRI system.

The MRI system shown in FIG. 1 comprises a magnet 1 generally formed into a cylinder shape having a hollow portion therein for placing a patient P, and a static power source 2 for supplying required electric current to the magnet 1. When the magnet 1 begins to work, a static field, having a uniform magnetic strength $H_o$ and being directed in a Z-direction along the body axis of the patient P, is formed in the central diagnostic space in the hollow portion of the magnet 1.

In the hollow portion of the magnet 1, there is provided a gradient coil portion 3. The gradient coil portion 3 includes two pairs of x-coils $3x \ldots 3x$ for generating a field gradient in an X-direction, two pairs of y-coils $3y \ldots 3y$ for generating a field gradient in a Y-direction, and one pair of z-coils $3z$ and $3z$ for generating a field gradient in the Z-direction.

An RF coil 4 is disposed in the inner space of the magnet 1, whereby the patient P inserted into the inner space is surrounded by the RF coil 4 and the gradient coils $3x \ldots 3z$. The RF coil 4 is in charge of transmitting and receiving radio frequency (RF) magnetic pulses to and from the patient P.

The MRI system is also provided with a main controller 10 controlling the entire system, a gradient sequence controller 11 controlling the pulse sequences to the field gradients, an RF sequence controller 12 controlling the pulse sequence to the RF signal. The main controller 10 comprises a computer for entire control. The main controller 10 can send a start signal and a stop signal of the pulse sequences to the controllers 11 and 12.

The gradient sequence controller 11 is also provided with a computer which stores a program of a pulse sequence in accordance with a multi-slice and a gradient field echo process, for example. In response to the start signal from the main controller 10, the gradient sequence controller 11 is to supply digital control signals corresponding to the field gradients in the X-, Y- and Z-axes to three digital to analogue (D/A) converters 13X, 13Y and 13Z, respectively. The D/A converters 13X, 13Y and 13Z are each connected to X-axis, Y-axis and Z-axis gradient power sources 14X, 14Y and 14Z where pulsed currents are generated. The X-axis, Y-axis and Z-axis gradient power sources 14X, 14Y and 14Z are then coupled to the x-coils $3x \ldots 3x$, y-coils $3y \ldots 3y$, and z-coils $3z$ and $3z$, respectively.

As shown in FIG. 1, the aforementioned RF sequence controller 12 is connected to the RF coil 4 by way of a transmitter 20 and a receiver 21. The transmitter 20 is designed to supply a radio frequency (RF) pulsed current to the RF coil 4. Thus a high frequency magnetic field generated from the RF coil 4 is sent to a diagnostic portion of the patient P. MR signals emitted from the diagnostic portion of the patient P can be detected by the RF coil 4 and received by the receiver 21 through control of the RF sequence controller 12. Besides, operation timing is synchronized between the controllers 12 and 11.

The received MR signals are sent to a data calculator 25 to be reconstructed therein into corresponding image data with Fourier transformation, for example. The image data thus-reconstructed is designed to be stored in a data memory unit 26.

The main controller 10 is also connected to an input device 27 by which an operator can give necessary information to the system, a program memory unit 28 where necessary programs including a program of designating a slice position prior to a scanning for diagnosis is stored, and a display unit 29 displaying reconstructed diagnostic images and other necessary information. The reconstructed image data can be supplied to the main controller 10 from the data memory unit 26 when necessary.

Figure 2:
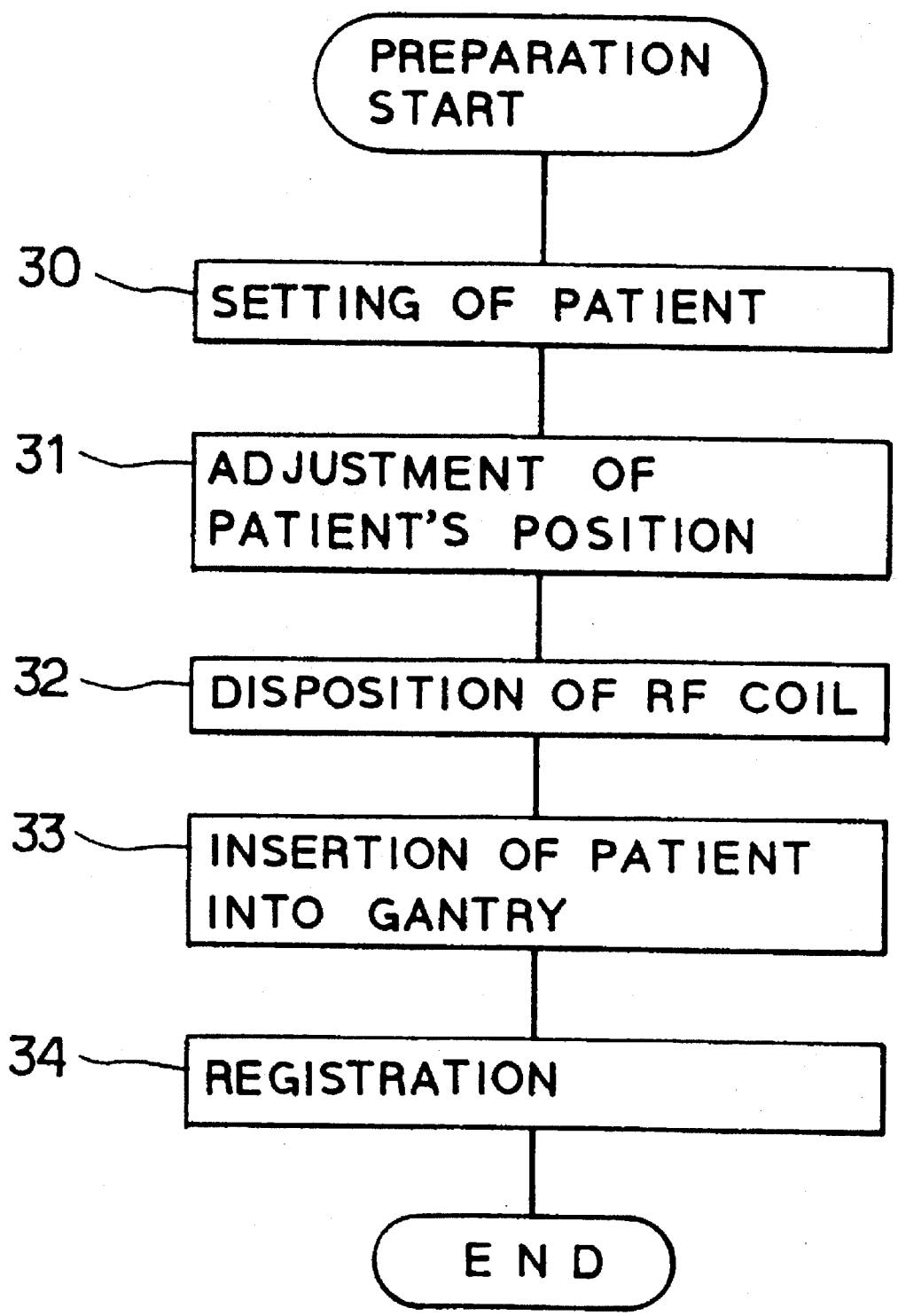
FIG. 2 shows a preparation routine for positioning.

According to FIG. 2, an example of general procedures for preparation will now be described.

First, a patient will be laid down on a tabletop of a couch (refer to STEP 30). Then the patient is positioned straight along the tabletop and is set at a predetermined reference point in a Z- and X-axes by a light beam (refer to STEP 31). An RF coil will then be selected to direct to a diagnostic portion of the patient and be disposed within a gantry (refer to STEP 32). In case that a whole-body RF coil will be required, it has already been pre-disposed within the gantry.

After this disposition, the patient is inserted with his or her body laid down on the tabletop into the gantry (refer to STEP 33). Through the input device 27, an operator then register the name of a patient, the date of the patient's birth, a measurement pose and other articles about the patient (refer to STEP 34).

Figure 3:
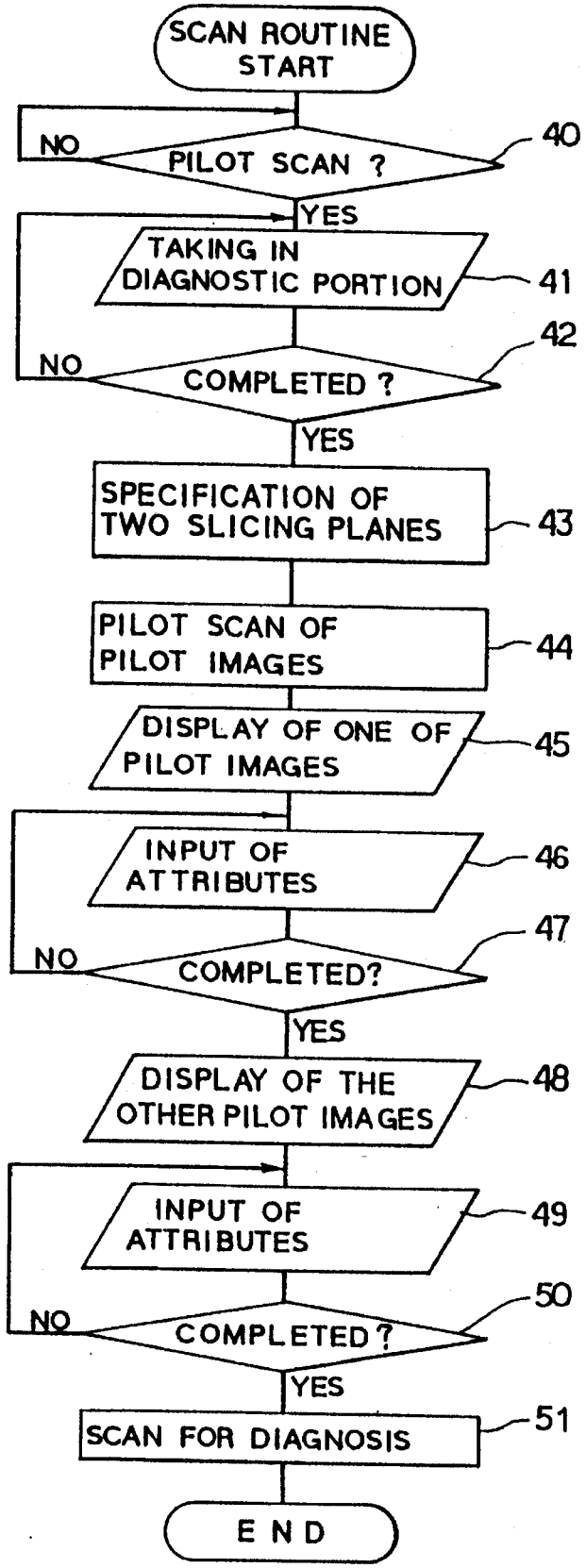
FIG. 3 shows a procedure from positioning to scanning for diagnosis.

When such preparation has been completed, then a scanning routine will be followed, whose procedure is exemplified in FIG. 3. The scanning routine includes, in its first half part, steps for designating a scan position to be scanned, which is called positioning.

At STEP 40 in FIG. 3, the main controller 10 judges whether a pilot scan for positioning should be carried out or not by checking an instruction from the operator. As long as the answer No comes out in the judgement, the controller 10 waits with STEP 40 repeated. When the answer YES comes out, processes of STEPS 41 and 42 will now be followed. At STEP 41, information in respect to a diagnostic portion (for example, the head) of the patient is given, and at STEP 42, whether the input at STEP 41 is completed or not is judged.

The judgement of YES at STEP 42 allows the controller 10 to move to a next STEP 43. At STEP 43, in conformity to the diagnostic portion designated at STEP 41, information specifying two slicing planes clinically suited is read out from the program memory unit 28. For example, if the designated diagnostic portion is the patient's head, information specifying a combination of an axial plane and a sagittal plane perpendicular to each other is selected and read out (see FIG. 4). If the designated diagnostic portion is the patient's abdomen, two selected and read-out planes are an axial plane and a coronal plane also perpendicular to each other (see FIG. 5).

Then, at STEP 44, the controller 10 orders a pilot scan. That is, the controller 10 sends a command to the gradient sequence controller 11 and the RF sequence controller 12 so as to obtain pilot images for positioning in accordance with the two slicing planes designated at STEP 43 by using a multi-angle and multi-slice method. This one-time pilot scan can produce at the same time tomographic images (i.e., pilot images) along the two magnetically sliced planes. In other words, in case that the head is objected for diagnosis, the two pilot images are the axial image A and the sagittal image S shown in FIGS. 6(a) and (b), and in case of abdomen scanning, there provided are the axial image A and the coronal image C shown in FIGS. 7(a) and (b). The pilot images thus-obtained are stored in a predetermined area of the data memory unit 26.

After the pilot images have been prepared in such a manner, the main controller 10 will go on to STEPS 45 to 47. At STEP 45, one of the two pilot images (for example, the axial image A in case of the head imaging) is displayed on the display unit 29. At STEP 46, with the displayed pilot image A being analyzed, the operator plans the scanning for diagnosis by placing a region of interest (ROI) on its screen. The ROI specify attribute data of images being obtained by the scanning for diagnosis; that is, in case of head scanning, for the axial image A as one of the pilot images like the one shown in FIG.6(a), a desired scanning range Ea and its center (i.e., object center) in the encoding direction and a desired scanning range Ra and its center (i.e., object center) in the reading direction. Then at STEP 47, it is judged whether the attribute data input has been finished or not, and the judgement YES there after leads to the next STEPS 48 to 50.

At STEP 48, the rest of the two pilot images is displayed (for example, the sagittal image S in case of the head imaging as shown in FIG. 6(b)). At STEP 49, the operator looks at the displayed sagittal image serving as one of the pilot images and place a ROI thereon in the slicing direction. The placement of the ROI aims at compensating for lack of quantitative information in designation using one pilot image only. Practically, as illustrated in FIG. 6(b), a slicing range Sa including a slicing number in the sagittal image S is designated by the ROI, which can complete designation of attribute data for the scanning followed. Then at STEP 50, the completion of processing at STEP 49 is judged. If the judgment is YES thereafter leads to next STEP 51.

On the other hand, in case that the abdomen scanning is selected at STEP 41, an axial image A and a coronal image C become the two pilot images, as already shown in FIGS. 7(a) and (b). Thus, center positions of the abdomen and desired scanning ranges Eb and Rb in the both encoding and reading directions are designated on one pilot image (axial image A) through ROI (see STEP 46). A desired slicing range Sb including a slicing number in the slicing direction is also designated on the other pilot image (coronal image C) through ROI (see STEP 49).

At STEP 51, the scanning for diagnosis is performed, in accordance with the attribute data designated so far, by the multi-slice imaging known widely. As a result, the scanning for diagnosis can produce at one time the designated number of axial images as diagnosed images, as shown in FIG. 6(c) or FIG. 7(c). The diagnostic axial images thus-obtained have the attributes just designated at STEPS 46 and 49. The diagnostic axial images are then stored in the data memory unit 26 and displayed on the display unit 29 if necessary.

As apparent from the above, the operator can use two pilot images complement each other in regard to designation of the scanning ranges, and can designate the scanning ranges as desired, with the scanning ranges displayed and confirmed. As a result, by providing the proper scanning ranges, the object center is located exactly at the center of the FOV and the object lies within the FOV when displayed. Thus, wrap around artifacts due to aliasing can be prevented easily and completely and FOV-adjustable techniques can be utilized effectively, resulting in decreased scanning time. In addition, it is possible to designate a proper slicing range to cover a lesion sufficiently.

Figure 8A:
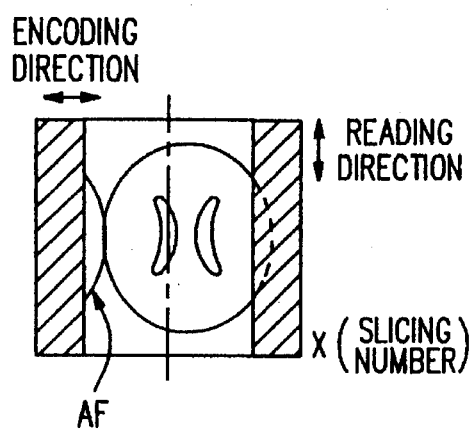
FIGS. 8A to 8C represent each drawbacks in prior arts.
Figure 8B:
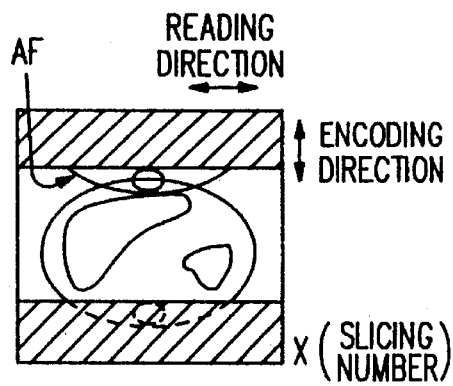
Figure 8C:
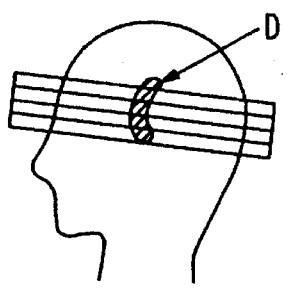

In the prior arts described before, deviation of an object center or/and an inadequate FOV sometimes lead to wrap around artifacts AF as shown in FIG. 8A and 8B, wherein FIG. 8A shows a head axial image and FIG. 8B an abdomen axial image. Further, insufficient slicing range gave rise to an uncovered region of a lesion as shown in FIG. 8C. However, such disadvantages are eliminated according to the proper positioning in the present invention, as having been explained before.

Further, the one-time pilot scan for the pilot images prevents the total scan time from being increased. Still further, for higher accuracy in positioning, the above embodiment keeps relatively simplified scanning procedure as a whole. All these advantages result in decreased operation time and operation load.

Now, the following table shows a summary of the attributes for diagnostic images. The attributes correspond to the scanning parameters for defining scanning ranges in the slicing, phase-encoding and reading directions. In the table, "possible" or "impossible" means that corresponding designation is possible or impossible. If a change in encoding is required, the word "encoding direction" and "reading direction" should be exchanged. As shown in the table, it is also possible to designate a desired scanning range and its center in the reading direction by using a sagittal image (in case of head scan) or a coronal image (in case of abdomen scan). Therefore, it may be adopted to use a method that an axial image (as one of the pilot images) provides only a scanning range and its center in the encoding direction and a sagittal or coronal image (as the rest of the pilot images) provides both a scanning range and its center in the reading direction and a slicing range in the slicing direction.

TABLE

| attributes | pilot image (axial image) | pilot image (sagittal/coronal images) |
|---|---|---|
| scanning range & its center in reading direction | possible | possible |
| scanning range & its center in encoding direction | possible | impossible |
| slicing range in slicing direction | impossible | possible |

A second embodiment of the present invention will now be described according to FIGS. 9A, 9B to 12. In the second embodiment, a saturation method will be included. An MRI system in this embodiment (and also the following embodiment) adopts the same hardware structure as the previously said one, and the explanation in respect to the hardware structure is omitted.

The purpose of the saturation method in MRI is to prevent artifacts resulted from breathing and body motions of a patient and blood flow therein by suppressing MR signals from a particular portion of a patient's body. For example, in case of scanning a sagittal image of one's cervical vertebrae, an artifact DG due to the deglutition movement may be superimposed on clinically interested parts of the sagittal image as shown in FIG. 9A, thus deteriorating diagnosis. In order to avoid it, a saturation method is used. This method adopts a technique in which a slab-like part covering one's throat is actively designated as a saturation region with no MR signals emitted. As a result, diagnostic images have a blackened region ST therein corresponding to the designated saturation region, like shown in FIG. 9B, but have no artifacts due to the deglutition movement.

Figure 10:
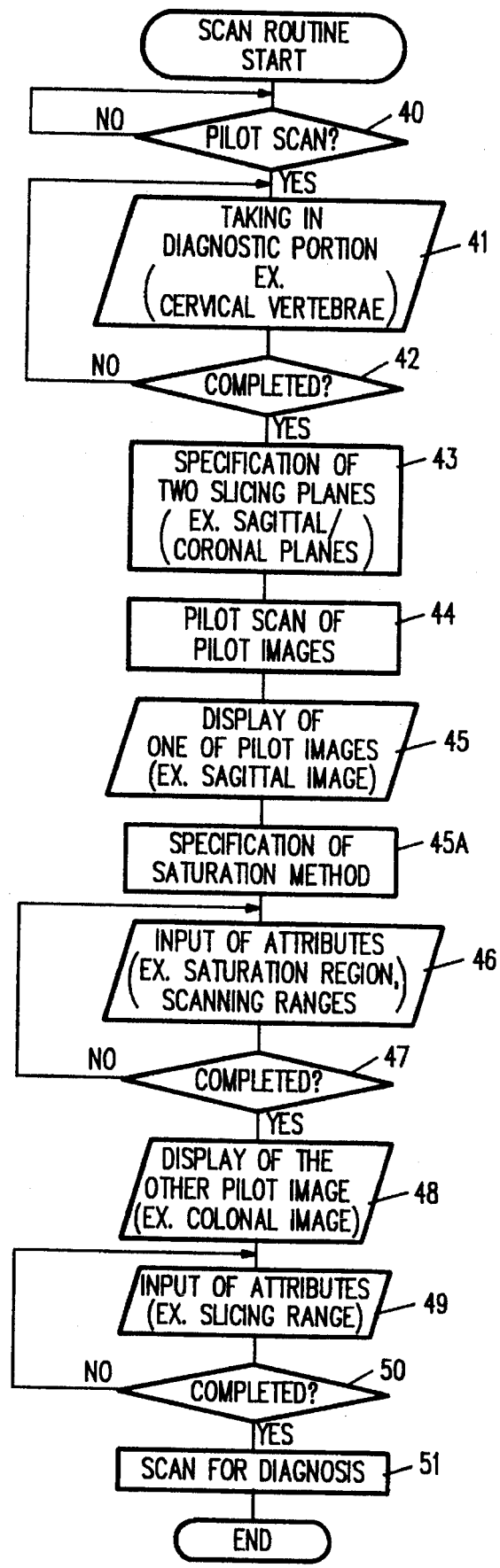
FIG. 10 shows a procedure from positioning to scanning for diagnosis in a second embodiment.

In the second embodiment, FIG. 10, carried out by the main controller 10, represents a scanning procedure including the above-mentioned saturation method and FIG. 11 exemplifies images. Preparation for the scanning will also be done with the same manner as the first embodiment (see FIG. 2). In addition, steps of FIG. 10 having the same function as those of FIG. 3 have the same reference numerals to avoid repetitive explanation.

With a pilot scan for positioning determined (refer to STEP 40 in FIG. 10), at STEP 41, information of a diagnostic portion (for example, cervical vertebrae in this embodiment) is taken in by the main controller 10. After the completion of this input (refer to STEP 42), at STEP 43, two different slicing planes are decided according to the designated diagnostic portion "cervical vertebrae". The suitable two slicing planes for the cervical vertebrae are, for example, a sagittal and a coronal planes. Then at STEP 44, a pilot scan with methods of multi-slice and multi-angle and two-dimensional Fourier transformation is carried out to produce a sagittal image S and a coronal image C as pilot images for positioning.

Then at STEP 45, the main controller 10 displays one of the pilot images, the sagittal image S, at the display unit 29, as shown in FIG. 11(a). Then at STEP 45A, it is recognized that the saturation method should be adopted. This recognition requires an operator to input information defining desired saturation regions as well, as one of attributes of diagnostic images.

Then at STEP 46, with the displayed sagittal image S observed, the operator designates not only a scanning range ED and its center position in an encoding direction and a scanning range RD and its center position in the reading direction with a first region of interest ROIa, but also a saturation region ST with a second region of interest ROIb. The saturation region, theoretically restricted to slab-like configurations, can be designated by giving such figures as its width, position and tilt angle, and a necessary number of the region (in some cases, combined plural saturation regions are used, as illustrated in FIG. 12).

Further, the completion of the above designation (refer to STEP 47) will be followed by displaying the coronal image C as the other pilot image, like shown in FIG. 11(b), at STEP 48. Then at STEP 49, with the displayed coronal image C observed, the operator designates a desired slice range SL in a slicing direction with a region of interest ROIc.

Such designation has been finished (refer to STEP 50), at STEP 51, a scan for diagnosis will be performed according to the attributes designated at STEPS 46 and 49. The scan here uses a multi-slice method and a two-dimensional Fourier transformation. As a result of the scan, as illustrated in FIG. 11(c), sagittal images for diagnosis with designated slice numbers are acquired by the one time scanning.

These diagnostic sagittal images are characterized by the same field of views as the designated scanning ranges and their center positions in the both encoding and reading directions, with the object center position placed at the center of the FOV. Hence, there is no intervention based on the operator's intuition or experience in the positioning procedure, resulting in high accuracy in positioning according to the operator's designation. In addition, the designated saturation region ST allows the diagnostic image to expel artifacts due to the deglutition movement, as a substitute for the blackened display region. Accordingly, increased quality of diagnostic images leads to higher diagnostic capability.

The above positioning technique adopting a saturation method is not limited to the scan of the cervical vertebrae, and it is possible to any diagnostic portion, wherein any combination of two suitable slicing planes can be specified.

In the above embodiments, with a monitor screen big enough, two pilot images can share with each other on the same monitor screen, and all the attributes for diagnostic images are allowed to be designated at the same time without scrolling the screen.

Further, in addition to the multi-slice scanning adopted in the above embodiments, it is also possible to use other scan methods such as sequential slice techniques for two times scans.

Still further, the two slicing planes designated is not limited to being perpendicular to each other, and non-perpendicular angles between them are also possible. For example, it is usable that one of the two slicing planes is an oblique image or all of them are oblique slicing planes each other, if all the scanning ranges can be designated.

Furthermore, the combination of the two slicing planes can be changed depending on desired diagnostic portions.

A third embodiment of the present invention will now be described according to FIGS. 13 to 15. The scan in the third embodiment adopts a method in which one of the two pilot images is not displayed on a monitor, but exact scanning ranges are automatically calculated and designated.

A principle of positioning the above pilot image, which is not displayed, will now be explained. Profiles of an object being diagnosed in both encoding and reading directions can be detected without a scan. The word "profile" is meant here to be a projected range of the object onto a certain direction.

Figure 13:
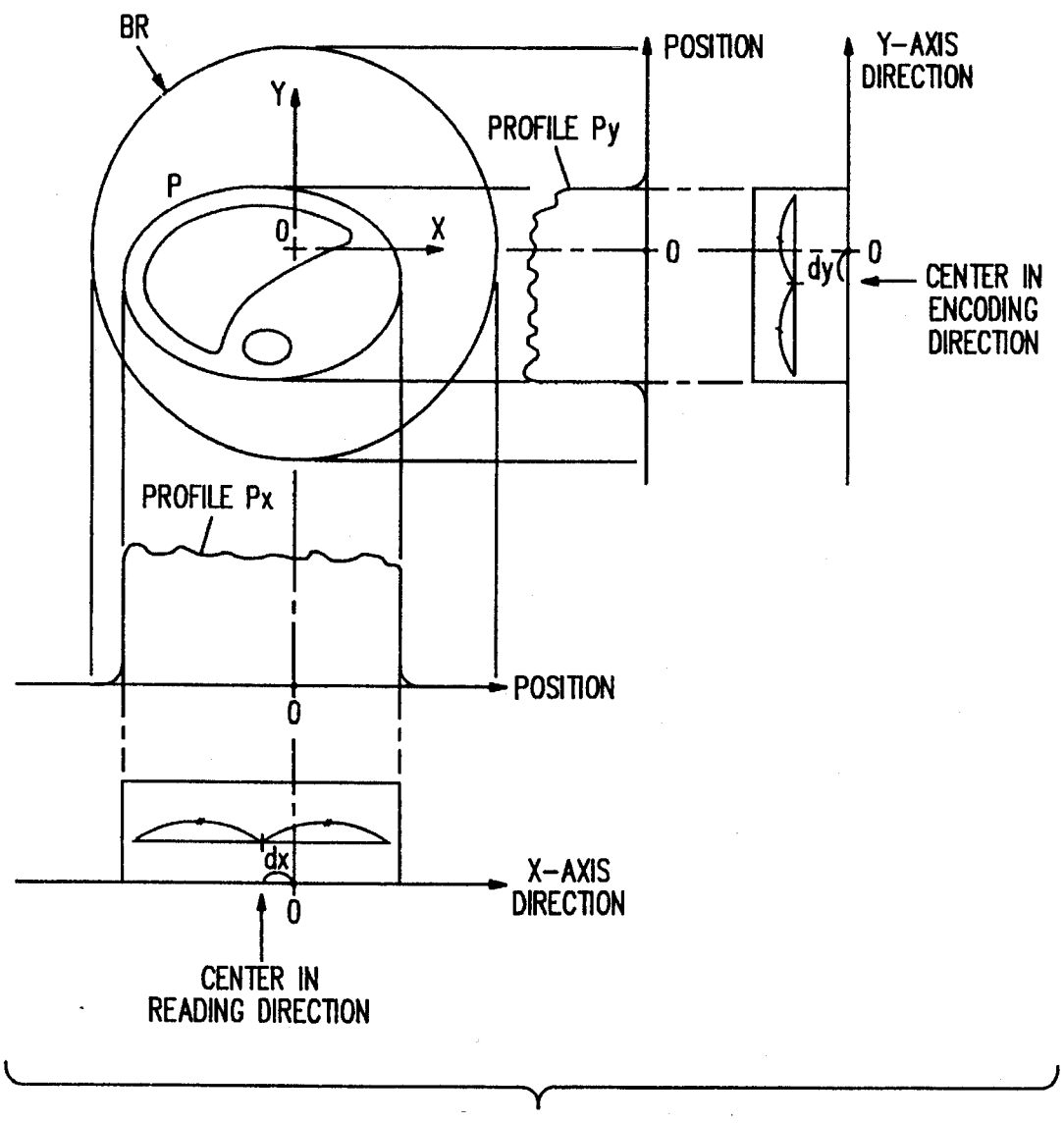
FIG. 13 shows a principle for calculating profile data.
Figure 14:
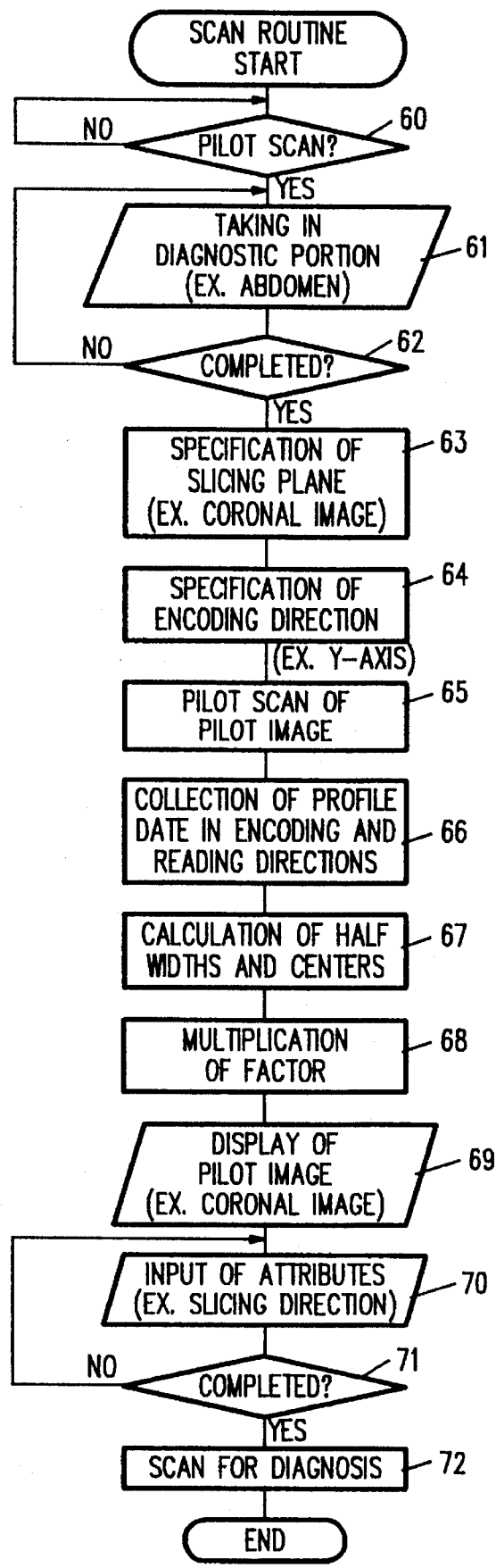
FIG. 14 shows a procedure from positioning to scanning for diagnosis in a third embodiment.

FIG. 13 shows a condition where a magnet bore BR accommodates the abdomen of a patient P therein. In FIG. 13, a center in a radial cross section of the bore BR is set as a system center O (i.e., origin), an X-axis (transverse axis in the figure) through the system center O is set as a reading direction, and a Y-axis (longitudinal axis in the figure) through the system center O an encoding direction, which makes a coordinate system as shown therein.

A profile Py in the Y-axis can be acquired in such a manner that a gradient field for reading in the Y-axis is applied with no gradient field for encoding, and collected MR data are processed by a Fourier transformation. Also a profile Px in the X-axis can be acquired in such a manner that a gradient field for encoding in the X-axis is applied with no gradient field for reading, and collected MR data are processed by the Fourier transformation. Origins as reference points in the X- and Y-axes can be decided unequivocally by the system origin O. Therefore, when the center of the abdomen does not exist at the system center O as shown in FIG. 13, the deviations dx and dy between the centers of the profiles Px and Py and the origins in each axis can define the centers of scanning ranges, respectively, which leads to the center in image reconstruction. The centers of the profiles Px and Py can be decided by its half width. The half widths of the profiles Px and Py can also define the scanning ranges (that is, FOV) in the both encoding and reading directions.

Next, the procedure of the scan will be explained according to FIG. 14.

The processes at STEPS 60 to 62 are the same as STEPS 40 to 42 in FIG. 3. Let's assume that at STEP 61 the diagnostic portion is-designated as the abdomen of a patient P.

At STEP 63, a first slicing plane by which an operator is able to designate a scanning range in the slicing direction to diagnostic images will be designated by the main controller 10. For example, the slicing plane is a coronal plane for the abdomen. At this step, there also judged by the main controller 10 is a second slicing plane, for example, axial plane, in which scanning ranges to diagnostic images are calculated without display. Then at STEP 64, an encoding direction is assigned to a predetermined axis, Y-axis, for instance. At this step, a reading direction will be also set.

Then at STEP 65, a pilot scan is performed along the designated first slicing plane. Then at STEP 66, profile data Px and Py in the encoding and reading directions are each collected in a manner described above, and collected data are stored into the data memory unit 26. Further, at STEP 67, there calculated are, using the stored data, the half widths and the deviations dx and dy of the profiles in the encoding direction (Y-axis) and the reading direction (X-axis). At STEP 68, each half width calculated is multiplied by a margin factor having a predetermined value (e.g., 1.1), so that a slight safety margin between the designated scanning ranges and the object being scanned can be given to firmly prevent wrap-around artifacts being generated when displayed.

Figures 15A, 15B:
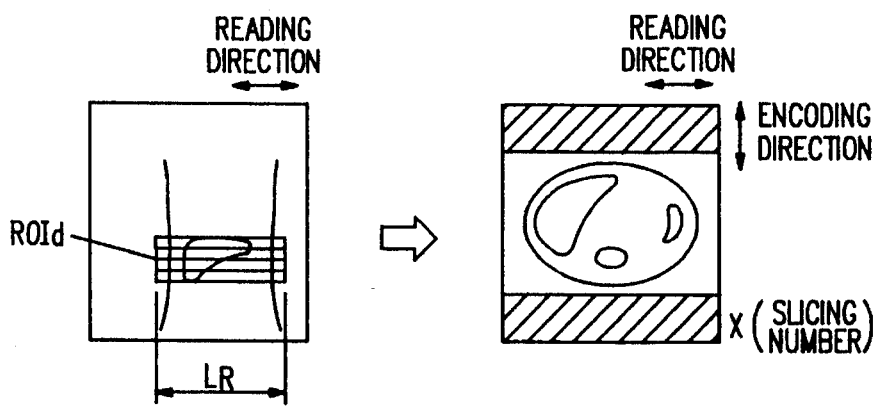
FIG. 15 is an image example illustrating the abdomen scan in the third embodiment.

After such calculations, at STEP 69, the pilot image (coronal image C) had been already scanned is displayed as shown in FIG. 15(a). Thus, a slicing range, as the attribute in the slicing direction, is designated through a region of interest ROId, so that the operator can designate the slicing range as desired. At this step in this embodiment, it is designated that the scanning range in respect to the reading direction is also designated using the coronal image C. Namely, predetermined default setting in the MRI system enables automatically the displayed region of interest ROId to place its center at the center (i.e., profile center) in the reading direction and to set its width $L_R$ in the reading direction to a value, given by the calculation involving the profile data Px. The calculation is given by making the half width double and multiplying the doubled figure by the margin factor. As a result, it is possible to automatically designate the scanning range in the reading direction together with the designation in the slicing direction, thus the designation being confirmed though by the operator's eyes.

Once such designation has been completed at STEP 71, diagnostic images are acquired by a scan using a multi-slice method. The scan for diagnosis is carried out depending on not only the centers and widths of the scanning ranges in the encoding and reading directions, all figures had been automatically calculated in the MRI system, but also the slicing range designated by the operator. As a result, as shown in FIG. 15(b), the scan produces diagnostic abdomen images to have the designated, sliced number and widths. For each of the diagnostic abdomen images, the designated centers of the scanning ranges become the center of the image reconstruction, that is, the center of field of view.

As apparent from the above, it is not necessary to display the pilot image concerning the designation of the scanning ranges in the encoding and reading directions, and instead, those scanning ranges including their centers are automatically designated based on the profile data by calculation. Hence, it remains for the operator only to designate the scanning range in the slicing direction with the displayed pilot image. In addition, in this embodiment, the scanning range and its center in the reading direction can also be examined by the operator's eyes when the slicing range is designated.

By the diagnostic scan including automatic designation without display, the field of view can properly be achieved such that the object lies exactly within it in the encoding direction and the center of the object can be positioned at the center of field of view. Thus, as said in the above-mentioned two embodiments, there is almost no possibility of generating wrap-around artifacts in diagnostic images. Further, because the designation by the operator is reduced to only one time in respect to the slicing direction, the operation procedure can be remarkably simplified and the operation load can be relieved.

In particular, for the positioning in the encoding direction, it is not required that a system center or a slicing position in an encoding direction of a pilot image be substituted for the center of a reconstruction image, which was used in the past.

By the way, the automatic designation of scanning ranges may be limited to only the encoding direction in the third embodiment.

What we claim is:

1. A method of magnetic resonance imaging of a desired diagnostic portion of an object carried out in accordance with three different scanning parameters for defining a scanning range in slicing, phase-encoding and reading directions within the diagnostic portion, the method comprising the steps of:

specifying two different slicing planes according to the desired diagnostic portion, said two slicing planes intersecting one another at an angle;

performing a one-time pilot scan of the two different slicing planes of the diagnostic portion to acquire magnetic resonance signals yielded therefrom, the pilot scan including at least a multislice imaging procedure;

obtaining two pilot images from the magnetic resonance signals acquired during the one-time pilot scan of the specified two different slicing planes;

displaying one of the two pilot images;

designating a part of the scanning parameters on the one pilot image displayed;

displaying the other of the two pilot images;

designating a remaining part of the scanning parameters on the other of the two pilot images displayed; and performing the magnetic resonance imaging in accordance with the scanning parameters designated based upon the two pilot images displayed.

2. The method of magnetic resonance imaging as claimed in claim 1, wherein said two slicing planes are perpendicular to each other.

3. The method of magnetic resonance imaging as claimed in claim 2, wherein one of the two slicing planes is an axial plane of the diagnostic portion.

4. The method of magnetic resonance imaging as claimed in claim 3, wherein one of said scanning parameters is a center position of the scanning range.

5. The method of magnetic resonance imaging as claimed in claim 3, wherein either one of said designating steps designates the scanning range as a part of the scanning parameters in at least the phase-encoding direction of the said axial image.

6. The method of magnetic resonance imaging as claimed in claim 3, wherein either one of said designating steps designates the scanning ranges as a part of the scanning parameters in both the phase-encoding and reading directions of the axial image.

7. The method of magnetic resonance imaging as claimed in claim 2, wherein one of the two slicing planes is a sagittal plane of the diagnostic portion.

8. The method of magnetic resonance imaging as claimed in claim 7, wherein either one of said designating steps designates the scanning range as a part of the scanning parameters in at least the slicing direction of the sagittal image.

9. The method of magnetic resonance imaging as claimed in claim 8, wherein said scanning parameter in the slicing direction is a number of a plurality of slicing planes.

10. The method of magnetic resonance imaging as claimed in claim 7, wherein either one of said designating steps designates the scanning ranges as a part of the scanning parameters in both the reading and slicing directions of the sagittal image.

11. The method of magnetic resonance imaging as claimed in claim 10, wherein said scanning parameter in the slicing direction is a number of a plurality of slicing planes.

12. The method of magnetic resonance imaging as claimed in claim 7, wherein either one of said designating steps designates the scanning ranges as a part of the scanning parameters in both a phase-encoding and a reading direction of the sagittal image.

13. The method of magnetic resonance imaging as claimed in claim 2, wherein one of the two slicing planes is a coronal plane of the diagnostic portion.

14. The method of magnetic resonance imaging as claimed in claim 13, wherein either one of said designating steps designates the scanning range as a part of the scanning parameters in at least a slicing direction of the said coronal image.

15. The method of magnetic resonance imaging as claimed in claim 2, wherein either one of said designating steps further includes a step of defining a saturation region on the displayed image.

* * * * *